United States Patent
Pogge et al.

(10) Patent No.: US 6,599,778 B2
(45) Date of Patent: Jul. 29, 2003

(54) CHIP AND WAFER INTEGRATION PROCESS USING VERTICAL CONNECTIONS

(75) Inventors: H. Bernhard Pogge, Hopewell Junction, NY (US); Roy Yu, Poughkeepsie, NY (US); Chandrika Prasad, Wappingers Falls, NY (US); Chandrasekhar Narayan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/026,103

(22) Filed: Dec. 19, 2001

(65) Prior Publication Data

US 2003/0111733 A1 Jun. 19, 2003

(51) Int. Cl.[7] .............................................. H01L 21/00
(52) U.S. Cl. ...................... 438/118; 438/612; 438/106
(58) Field of Search ................................ 438/118, 119, 438/122, 612, 106, 108, 614, 628, 629, 109, 622

(56) References Cited

U.S. PATENT DOCUMENTS

| 5,166,097 A | 11/1992 | Tanielian |
| 5,229,647 A | 7/1993 | Gnadinger |
| 5,270,261 A | 12/1993 | Bertin et al. |
| 5,424,245 A | 6/1995 | Gurtler et al. |
| 5,786,270 A | 7/1998 | Gorrell et al. |
| 5,814,889 A | 9/1998 | Gaul |
| 5,817,986 A | 10/1998 | Davidson et al. |
| 5,818,748 A | 10/1998 | Bertin et al. |
| 5,918,113 A * | 6/1999 | Higashi et al. ............. 438/119 |
| 6,087,719 A | 7/2000 | Tsunashima |
| 6,093,969 A | 7/2000 | Lin |
| 6,101,100 A | 8/2000 | Londa |
| 6,124,149 A | 9/2000 | Paik et al. |
| 6,181,569 B1 | 1/2001 | Chakravorty |
| 6,188,129 B1 | 2/2001 | Paik et al. |
| 6,222,212 B1 | 4/2001 | Lee et al. |
| 6,235,552 B1 * | 5/2001 | Kwon et al. ................ 438/106 |
| 6,239,495 B1 | 5/2001 | Sakui et al. |
| 6,444,560 B1 * | 9/2002 | Pogge et al. ................ 438/612 |
| 6,511,901 B1 * | 1/2003 | Ian et al. .................... 438/612 |

* cited by examiner

*Primary Examiner*—Wael Fahmy
*Assistant Examiner*—(Vikki) Hoa B. Trinh
(74) *Attorney, Agent, or Firm*—Jay H. Anderson

(57) ABSTRACT

A process is described for semiconductor device integration at chip level or wafer level, in which vertical connections are formed through a substrate. A metallized feature is formed in the top surface of a substrate, and a handling plate is attached to the substrate. The substrate is then thinned at the bottom surface thereof to expose the bottom of the feature, to form a conducting through-via. The substrate may comprise a chip having a device (e.g. DRAM) fabricated therein. The process therefore permits vertical integration with a second chip (e.g. a PE chip). The plate may be a wafer attached to the substrate using a vertical stud/via interconnection. The substrate and plate may each have devices fabricated therein, so that the process provides vertical wafer-level integration of the devices.

16 Claims, 14 Drawing Sheets

CHIP AND WAFER INTEGRATION PROCESS USING VERTICAL CONNECTIONS

FIELD OF THE INVENTION

This invention relates to the manufacture of integrated circuit devices. More particularly, this application relates to a process for chip-level and wafer-level integration in which vertical interconnections are formed.

BACKGROUND OF THE INVENTION

The need for greater functionality and performance in semiconductor devices has resulted in the development of larger and more complex chips. In addition, it is often desirable to include several different functions on a single chip to obtain a "system on a chip," which generally results in both an increased chip size and a more complicated manufacturing process. These factors both tend to depress manufacturing yield. It is estimated that many such complex chips, with areas greater than 400 mm$^2$, will generally have very poor manufacturing yield (perhaps under 10%).

One method of maintaining acceptable yields is to manufacture smaller chips, and then to interconnect those chips using lateral and vertical connections on the chips or on support substrates. The interconnected chips thus form a single larger chip which is mounted on another chip, on a substrate or on a chip carrier. Besides improved manufacturing yield, another major advantage of this approach is that the individual chips may be of different sizes, perform different functions, or be fabricated by different or incompatible methods.

A system constructed according to this approach is illustrated schematically in FIG. 1A. The substrate or bottom chip 11 has several chips 10 mounted thereon, with lateral spacing Δx and Δy. For example, the bottom chip 11 may be a DRAM chip while the four chips 10 are processor ("processor engine" or PE) chips.

To realize the advantages offered by the system-on-a-chip (SOC) concept, the different chips are preferably in very close proximity and have very precise alignment with respect to each other. For example, spacing Δx and Δy between chips 10 is preferably about 50 μm or less.

Chips 10 may be placed on the substrate or bottom chip 11 with very high accuracy (within about 1 μm) by using a stud/via interconnection, shown schematically in FIG. 1B. In FIG. 1B, chip 10 has metal studs 12 formed on the terminal surface of the chip, with a layer 16 of a low-melting-point alloy material deposited on the surface of the stud. Dielectric layer 17 (often designed and fabricated as a multilayer structure of polyimide), on the surface of bottom chip 11, has embedded therein high-density wiring 18 (generally several levels of Cu conductors, as shown schematically in FIG. 1B), and has electrical joining pads 15 on the surface of layer 17. A dielectric layer 14 overlies the wiring layer 17; layer 14 may be formed of a polyimide material typically used in thin film packaging processing. Layer 14 has vias 13 formed therein (e.g. by reactive-ion etching, by photolithography or by an excimer laser), so that a terminal metal joining pad 15 is at each via bottom. The vias may be formed with a sloped wall angle as a guide for high-accuracy, self-aligned placement of the studs 12 in the vias 13. A thin coating 19 of thermoplastic polymer adhesive may be deposited on the top of the dielectric layer 14, to ensure reliable bonding to the chip surface. Details of this stud/via alignment and joining process are provided in U.S. patent application Ser. No. 09/669,531, entitled "Process for making fine pitch connections between devices and structure made by the process," the disclosure of which is incorporated herein by reference. The use of self-aligning stud/via interconnections permits a significantly higher wiring density compared to current C4 interconnection schemes.

In the SOC shown in FIG. 1A, the wiring layer extends laterally outside the area of chips 10. External connections are generally made at the perimeter 11a of the top surface of bottom chip 11. The overall size of the SOC therefore limits the space available for wirebonding to make the external connections. It is desirable that the external connections instead be made through the backsides of the chips, so that the connections are not restricted by wirebonding space requirements. Formation of a connection pad (e.g. C4 pad) on the backside 10b of a chip would require that electrical connections be made vertically through the chip body, to the device side (surface 10a) of the chip. Furthermore, building vertical interconnections through a device chip would facilitate vertical stacking of chips, effectively extending the SOC concept to three dimensions.

Accordingly, there is a need for a process for fabricating vertical interconnections in a multi-chip device such as an SOC, which permits three-dimensional chip interconnection and which can be practiced with high manufacturing yield.

SUMMARY OF THE INVENTION

The present invention addresses the above-described need by providing a process for vertical integration at chip level or wafer level, in which vertical connections are formed using a through-via in a chip.

According to a first aspect of the invention, a method is provided for fabricating a semiconductor structure. A feature is formed in the top surface of the substrate, and metal is deposited in the feature to make a conducting path. A liner may first be deposited in the feature to isolate the metal from the semiconductor material. A layer is then formed which overlies the top surface of the substrate; the layer includes an electrical conductor and a first conducting pad on a top surface of the layer, so that the first conducting pad is electrically connected to the feature. A plate is attached to this layer, and the substrate is then thinned at the bottom surface thereof to expose the bottom of the feature. A second conducting pad is formed on the bottom surface of the substrate to make an electrical connection to the bottom of the feature, so that the first conducting pad and the second conducting pad are electrically connected through the feature.

The substrate may comprise a chip having a device (e.g. DRAM) fabricated therein. Formation of a conducting path in a through-via in this chip therefore permits vertical integration with a second chip (e.g. a PE chip).

The plate may be a temporary handling plate to facilitate thinning of the substrate. If the plate is transparent to ablating radiation, it may be conveniently removed by ablating an interface between the layer and the plate.

According to another aspect of the invention, the plate is a semiconductor wafer which is not removed from the substrate; this wafer is attached to the substrate using a vertical stud/via interconnection. A second layer is formed on the above-described layer overlying the substrate, and a via is formed in the second layer exposing the first conducting pad. A stud is formed on the semiconductor wafer and aligned to the via; the wafer is then contacted to the second layer so that the stud makes electrical connection with the first conducting pad. Accordingly, the substrate and plate (semiconductor wafer) form a wafer system, and the substrate and plate may each have devices fabricated therein (e.g. DRAM and PE devices respectively). This process thus provides vertical wafer-level integration of the devices.

According to another aspect of the invention, a semiconductor structure is provided which includes a substrate; a first layer overlying the top surface of the substrate; conducting pads on top of the first layer and on the bottom surface of the substrate; a second layer on the first layer; and a plate contacting the first layer. The substrate has a via extending therethrough, with a first electrical conductor formed in the via. The first layer includes a second electrical conductor connecting the first electrical conductor with the conducting pad on top of the layer. The conducting pad on the bottom surface of the substrate is electrically connected to the first electrical conductor, so that the first conducting pad and the second conducting pad are electrically connected. The second layer has a via formed therein exposing the conducting pad on top of the first layer. The plate has a stud formed thereon, aligned to the via and making electrical contact with the conducting pad.

The present invention offers a significant advantage in that the through-via is formed in the substrate without an expensive deep-via etching process. Via dimensions may be maintained with very high fidelity, which in turn permits a high density of through-vias. Furthermore, the use of vertical stud/via interconnections allows for highly accurate chip placement in the third dimension, similar to the highly accurate lateral chip placement described above.

DETAILED DESCRIPTION OF THE PREFERRED EMBODIMENTS

In accordance with the present invention, a semiconductor device is fabricated which includes vertical electrical connections through a chip. These vertical connections are formed by constructing metallized through-vias in the chip, without the need for expensive deep via etching.

In the embodiments discussed below, two different types of chips are vertically connected. Specifically, in the examples shown, a DRAM chip (or silicon DRAM device wafer) is vertically connected to a plurality of PE chips (or a silicon PE device wafer). It will be appreciated that these types of chips are discussed for purposes of illustration only, and that the present invention may be practiced with a wide variety of chips and wafer types.

Formation of Metallized Vias

A metallized through-via in a semiconductor substrate, such as a silicon wafer, may be formed by depositing metal in a trench and thinning the wafer to open the bottom of the trench, as detailed below.

Figure 2A:
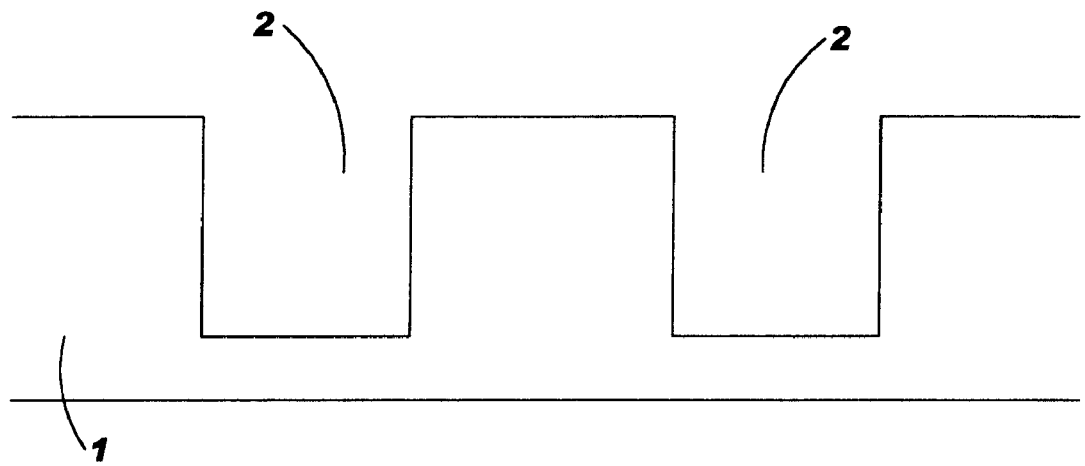
FIGS. 2A–2F illustrate steps in a process for forming a vertical interconnection through the body of a chip, in accordance with an embodiment of the invention.
Figure 2B:
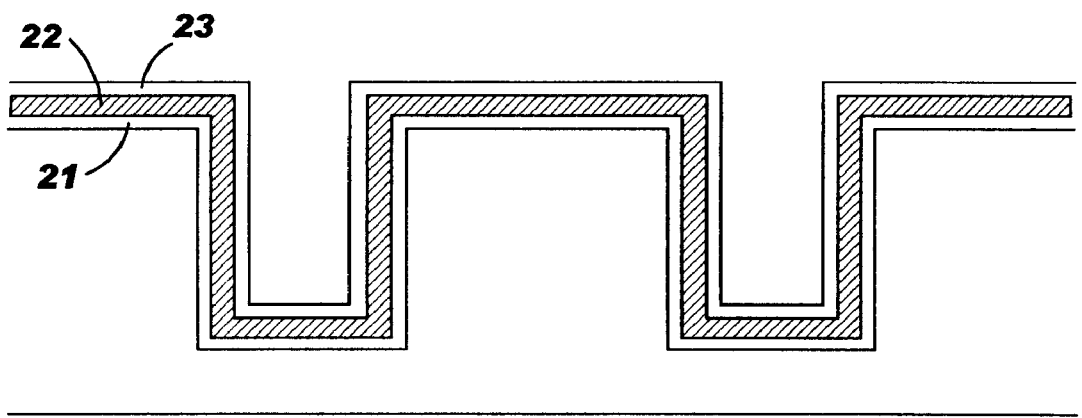

In a silicon wafer 1, prior to the fabrication of devices therein, trenches 2 are etched where the vertical connections are desired. As shown in FIG. 2A, the trenches do not extend through the wafer, but should extend into the bulk Si below the depth of the devices. An oxide layer 21 is grown or deposited on the wafer and in the trenches. A trench liner 22, typically of tungsten, is deposited on the oxide, preferably by chemical vapor deposition (CVD). A layer 23 of copper is then deposited on the liner. (As is understood by those skilled in the art, a liner is necessary when copper is used to metallize the trench; numerous alternative metallization schemes are possible which do not require a liner.) The deposition process for layer 23 is ionized physical vapor deposition (IPVD), to ensure a thin, conformal coating of the interior of the trench.

Figure 2C:
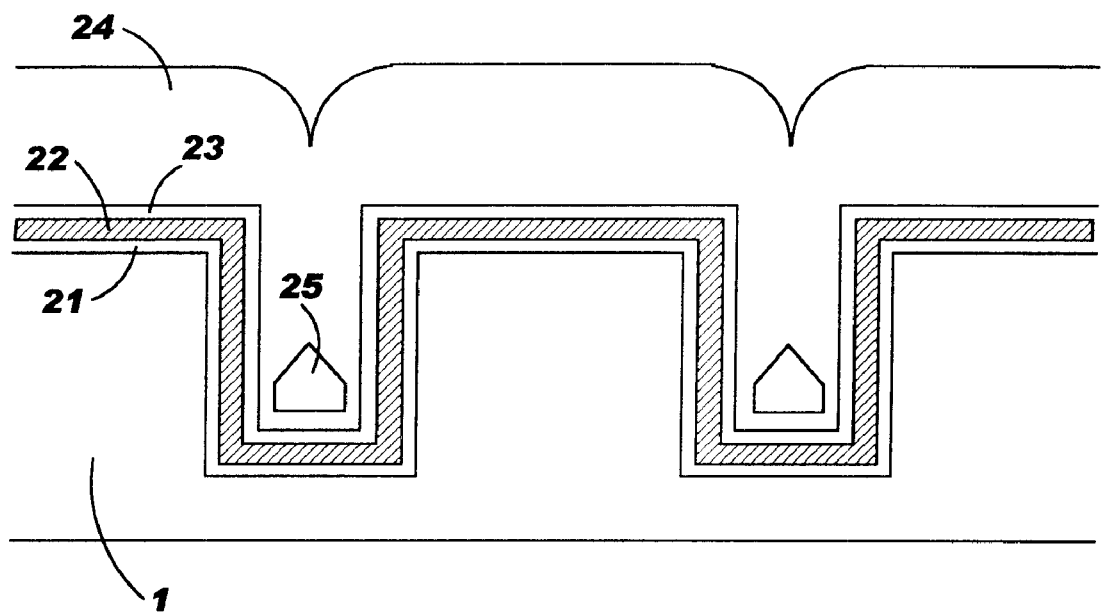

A layer 24 of copper is formed on layer 23 (e.g. by electroplating) in the trench and on top of the wafer. Layer 24 is built up on the sidewalls of the trench until it reaches a thickness such that the upper part of the trench is closed, as shown in FIG. 2C. With this structure, a conducting path is established between the bottom of the trench and the top surface of the wafer, while a void 25 remains near the bottom of the trench. It should be noted that the void 25 has an important function in relieving stresses caused by differences in the thermal coefficient of expansion (TCE) of the various materials in and around the feature.

Figure 2D:
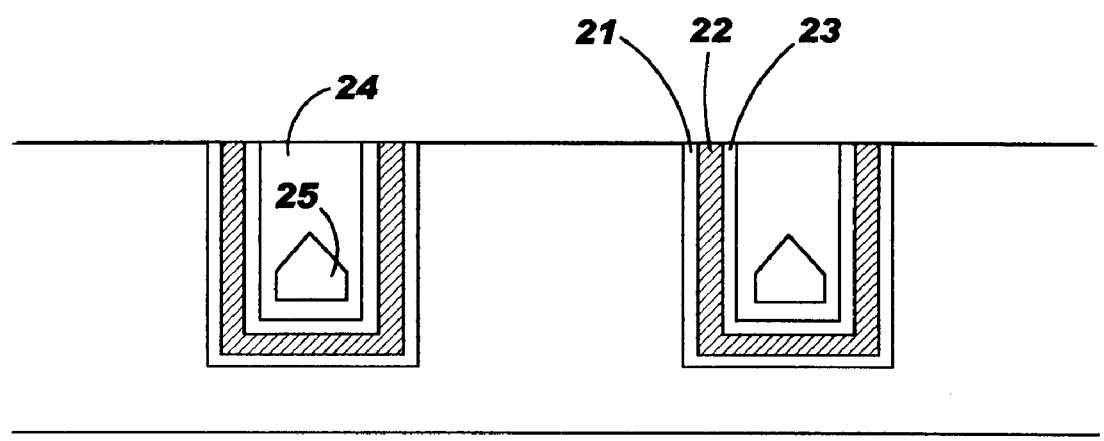
Figure 2E:
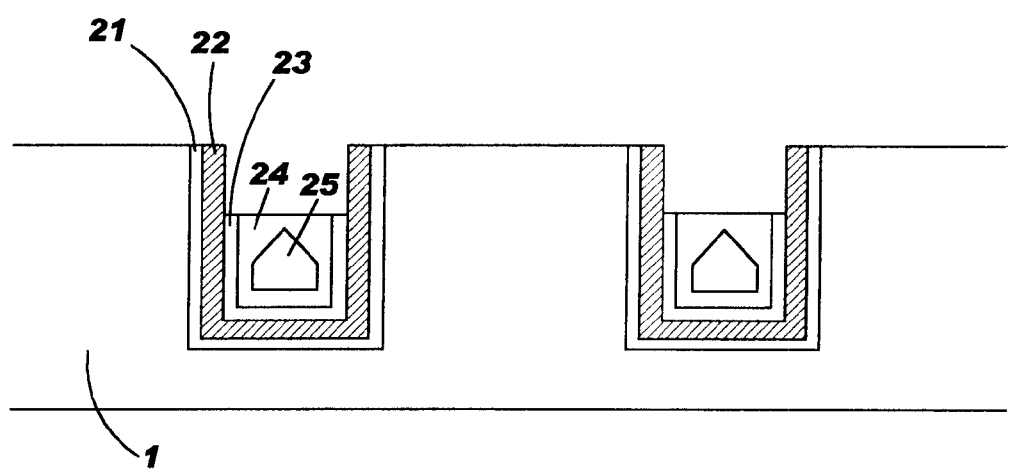
Figure 2F:
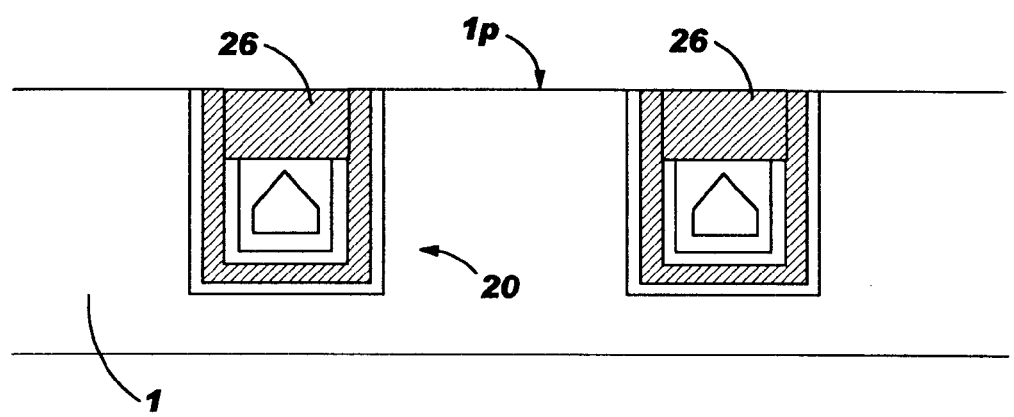

The wafer is then planarized, preferably by chemical-mechanical polishing (CMP), to remove layers 21–24 from the top surface of the wafer. The resulting structure is shown in FIG. 2D. The copper at the top of the trench is then etched away (by reactive sputtering or some other convenient process) to a depth of about 5 $\mu$m, to yield the structure shown in FIG. 2E. A layer of tungsten is deposited on the wafer (preferably by CVD) and the wafer is again planarized using CMP, leaving a tungsten layer 26 at the top of each trench and an exposed surface 1p of the silicon wafer (FIG. 2F). The trench structure 20 thus has copper metallization encased in tungsten.

The wafer is then ready to have devices formed therein near surface 1p, and to be further processed to obtain either chip-level or wafer-level integration.

Chip-level Integration

Figure 3A:
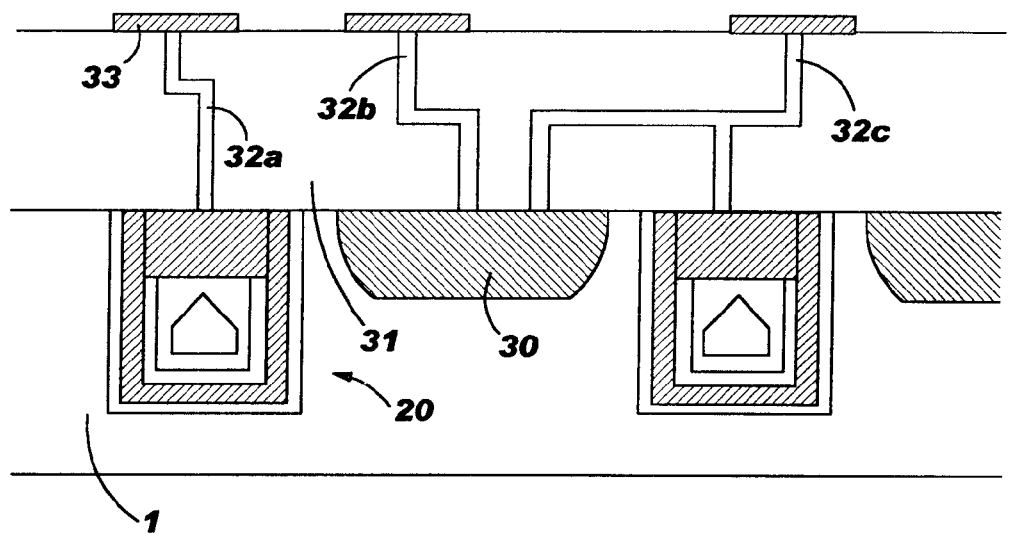
FIGS. 3A–3F illustrate steps in a process for obtaining chip-level integration of DRAM chips and processor (PE) chips using vertical interconnections, in accordance with an embodiment of the invention.

Devices 30, shown schematically in FIG. 3A, are fabricated in wafer 1 after the metallized trench structure 20 is completed. As shown in FIG. 3A, the devices are located in a region of wafer 1 adjacent to the top surface of the wafer. In this embodiment, devices 30 are DRAM devices. Dielectric layer 31 (typically polyimide) is then formed on top of the wafer; layer 31 has embedded therein high-density wiring 32a–32c, and has on its top surface electrical joining pads 33 for making external connections (e.g. to PE chips on top of the DRAM chip). Examples of possible connections are shown schematically in FIG. 3A. The electrical wiring may connect a metallized via to a joining pad (conductor 32a); a device to a joining pad (conductor 32b); or a device to a via and/or a joining pad (conductor 32c). Although layer 31, including the conductors, is shown as a single layer, it will be appreciated that for ease of manufacturing it is often designed and fabricated as a multilayer structure. Pads 33 are typically formed as a multilayer structure including a Ti—W alloy, Ni, and Au, but may also include Cu, Co or other combinations of metals.

Figure 3B:
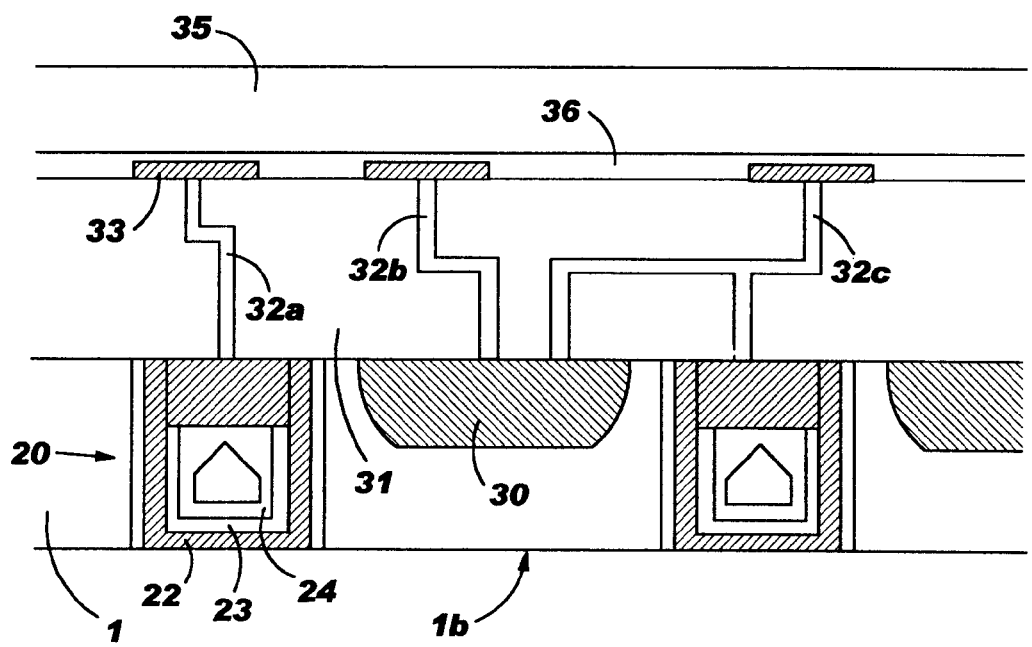

Wafer 1 is then thinned, by grinding, CMP, or some other convenient process, so that the interior of metallized via structure 20 is exposed at the bottom surface 1b or backside of wafer 1 (FIG. 3B). The thinned wafer may be difficult to handle or be incompatible with the equipment used in subsequent wafer processing. Accordingly, it may be desirable to attach a temporary handling plate to the wafer before the thinning process is performed, particularly if the final thickness of the wafer is less than 150 µm. In this embodiment, the wafer thickness is reduced to about 100 µm or less. As shown in FIG. 3B, a glass plate 35 is attached to the top surface of layer 31 using a layer of adhesive 36.

Figure 3C:
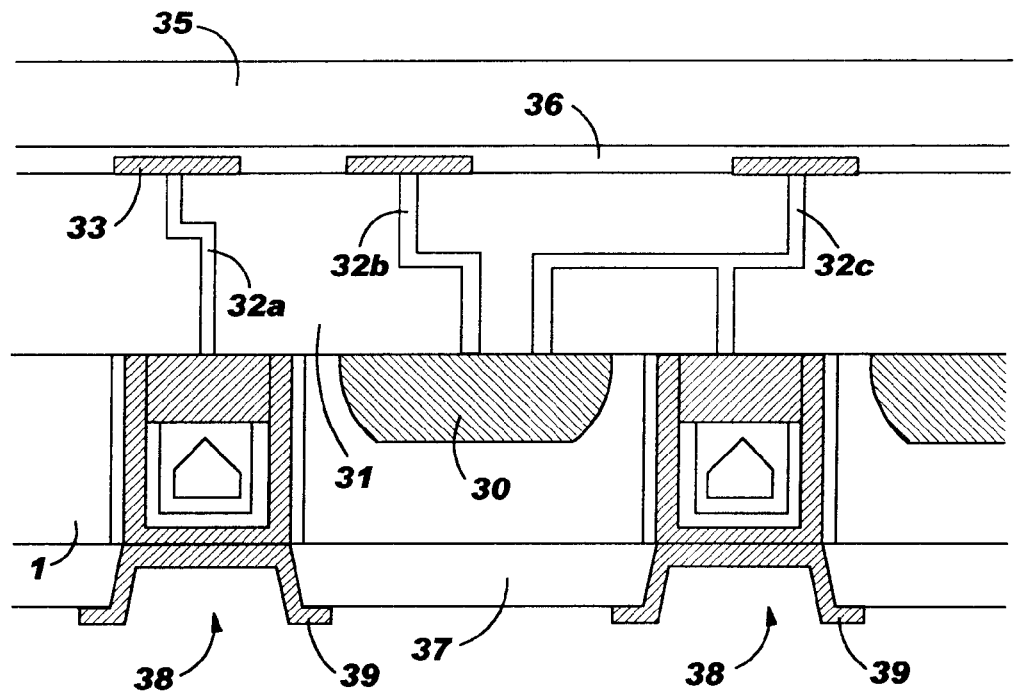

Each via structure 20 at this point is a through-via with tungsten layer 22 exposed on the bottom surface 1b of the wafer. An insulating layer 37 (e.g. polyimide) is deposited on surface 1b, and openings 38 are formed therein, at the locations of the vias 20. A metal layer (or combination of layers) is then deposited on layer 37 and patterned so that metal pads 39 are formed in and around the openings 38. Pads 39 typically have a structure similar to pads 33; that is, a multilayer structure including a Ti—W alloy, Ni, and Au. The resulting structure is shown in FIG. 3C.

Figure 3D:
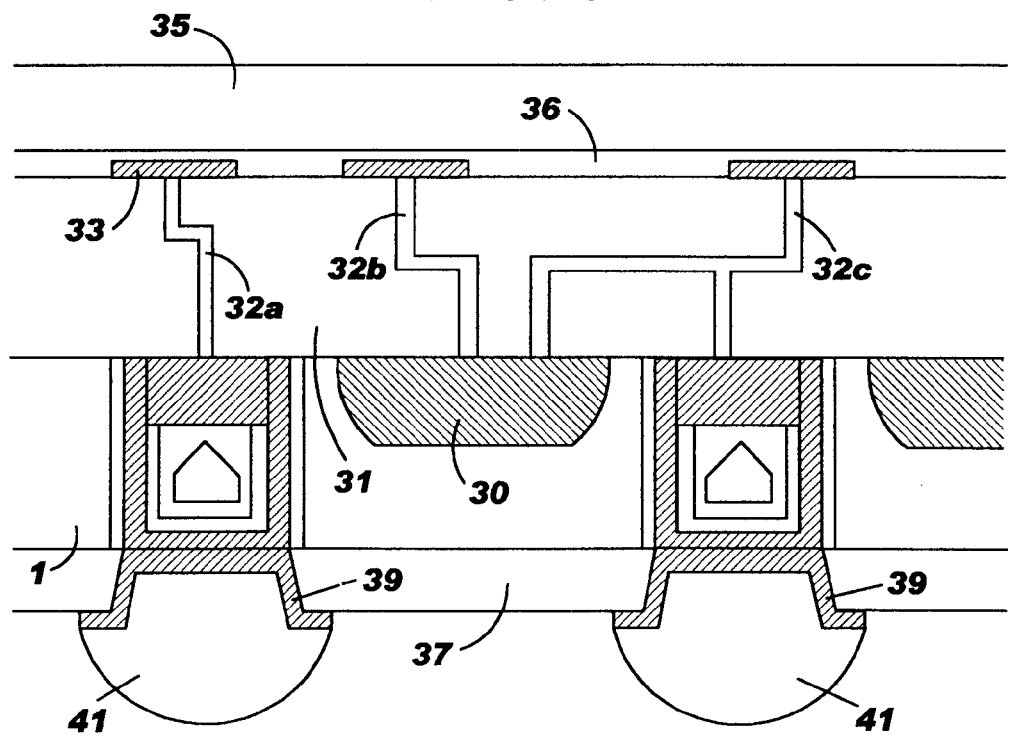

Solder bumps 41 are then formed on the back side of the wafer on pads 39, using methods known in the art. For example, a solder paste may be applied to the wafer through a screen, and the deposited solder subjected to a reflow process. FIG. 3D shows the wafer structure ready for dicing and joining to a carrier.

Figure 3E:
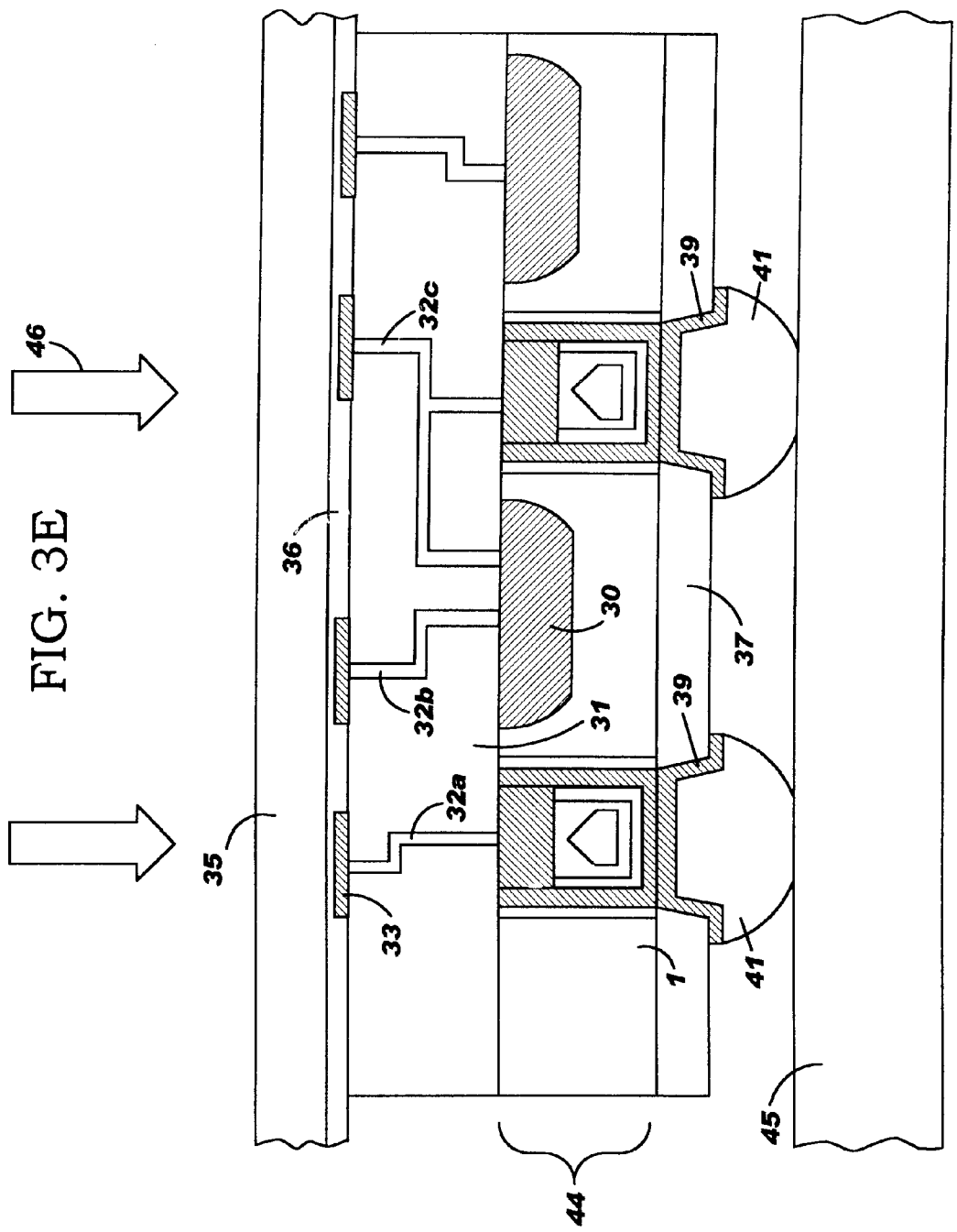

In this embodiment, the wafer is diced into chips 44 while the glass handling plate 35 is kept intact, as shown in FIG. 3E. Alternatively, the dicing process may include dicing of plate 35 (thus requiring handling of individual chips in the joining process). The chips are joined to a carrier 45; solder bumps 41 are typically connected to metal pads (not shown) at the top surface of the carrier. Carrier 45 may be another chip, a ceramic substrate, a circuit board, etc.

After the joining process, the temporary handling plate 35 is removed from the chips. This may be conveniently done by a laser ablation process, as shown schematically in FIG. 3E. Laser radiation 46, incident on glass plate 35, penetrates the plate and ablates the interface between the plate and the adhesive layer 36. This results in delamination of the plate from layer 36, so that plate 35 may be removed. The remaining adhesive is then cleaned away so that joining pads 33 are exposed.

Figure 3F:
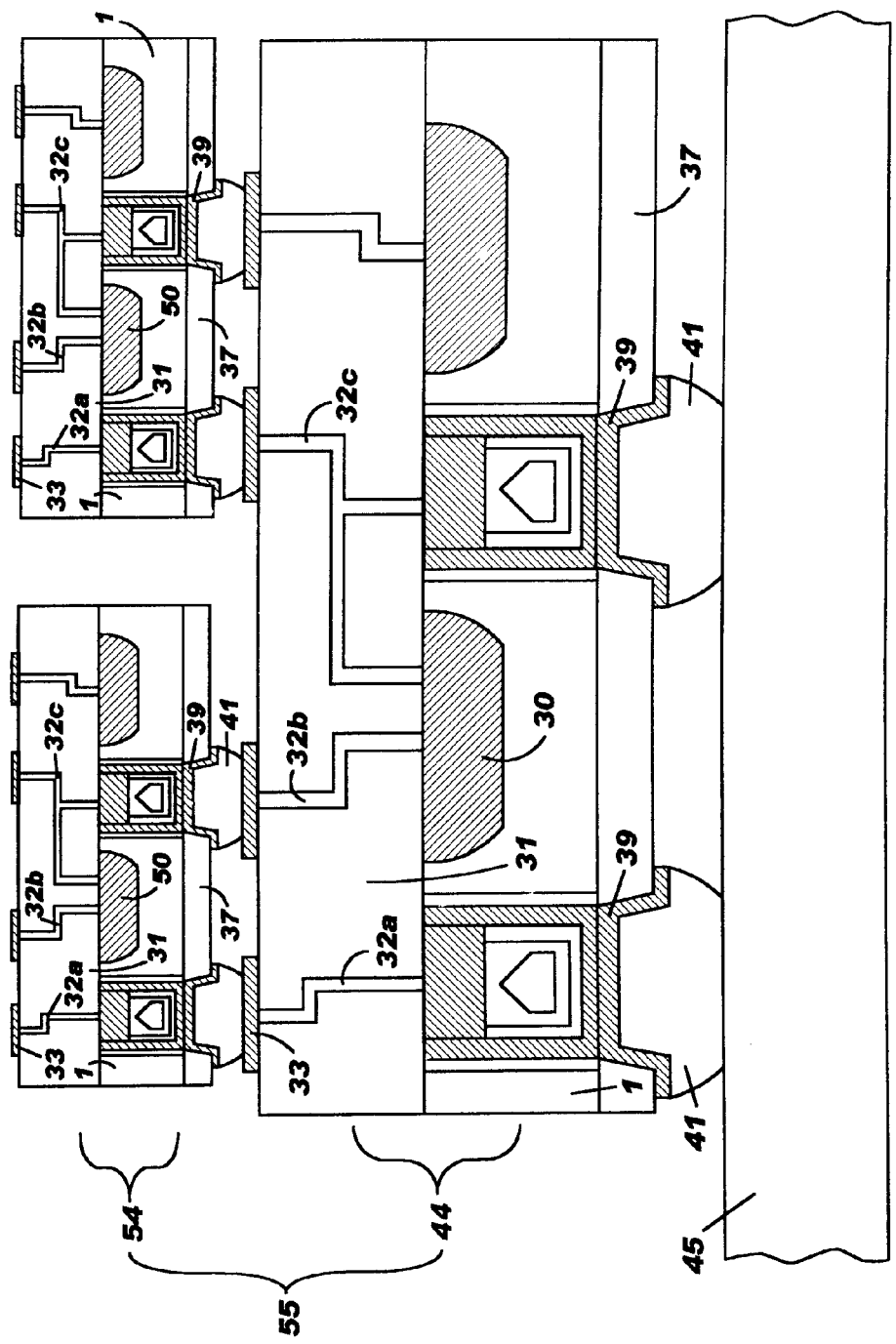

As shown in FIG. 3F, vertical integration of DRAM chips 44 and PE chips 54 is accomplished by bonding the PE chips to the joining pads 33 of the DRAM chips. In the PE chips 54, processing devices 50 are fabricated in the wafer; otherwise the PE chips are prepared according to the same method as described above, with similar structures indicated by repeated reference numerals in FIG. 3F. In particular, it should be noted that the joining pads 33 on the top surface of chips 54 may be used to make external connections to the vertically integrated structure 55, which includes a DRAM chip and a plurality of PE chips.

Figure 3G:
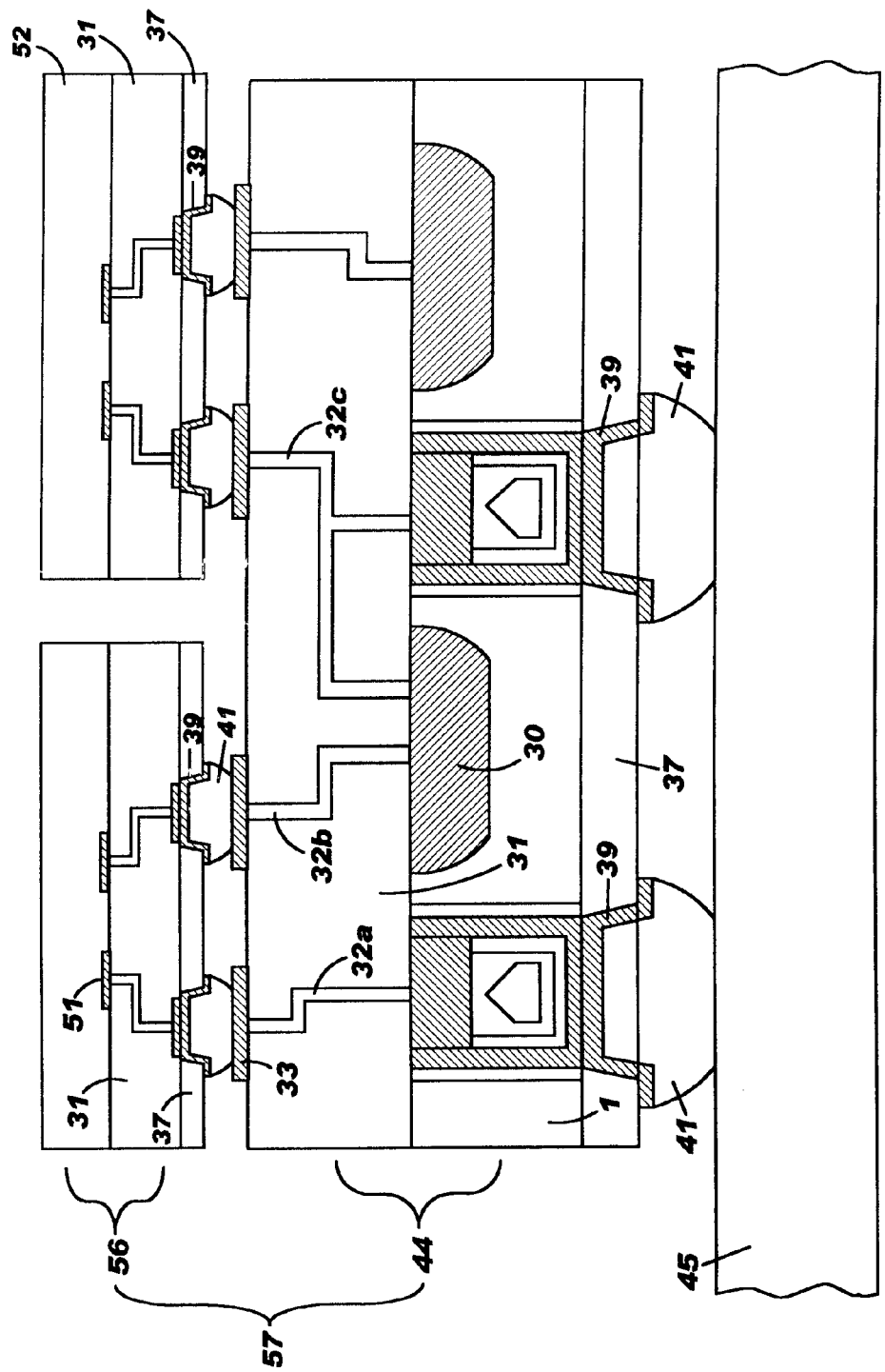
FIG. 3G illustrates an alternative chip-level integration using the vertical interconnections of FIG. 3F.

Alternatively, as shown in FIG. 3G, the PE chips may be conventional chips 56 (having devices 51 in substrate 52 and wiring layer 31) without vertical through-via connections. In this case the PE chips 56 are joined to chips 44 (which have vertical through-via connections) to form integrated structure 57.

Wafer-level Integration

In this embodiment of the invention, a metallized through-via is formed in a wafer, and another wafer is joined thereto using stud/via interconnections.

Figure 4A:
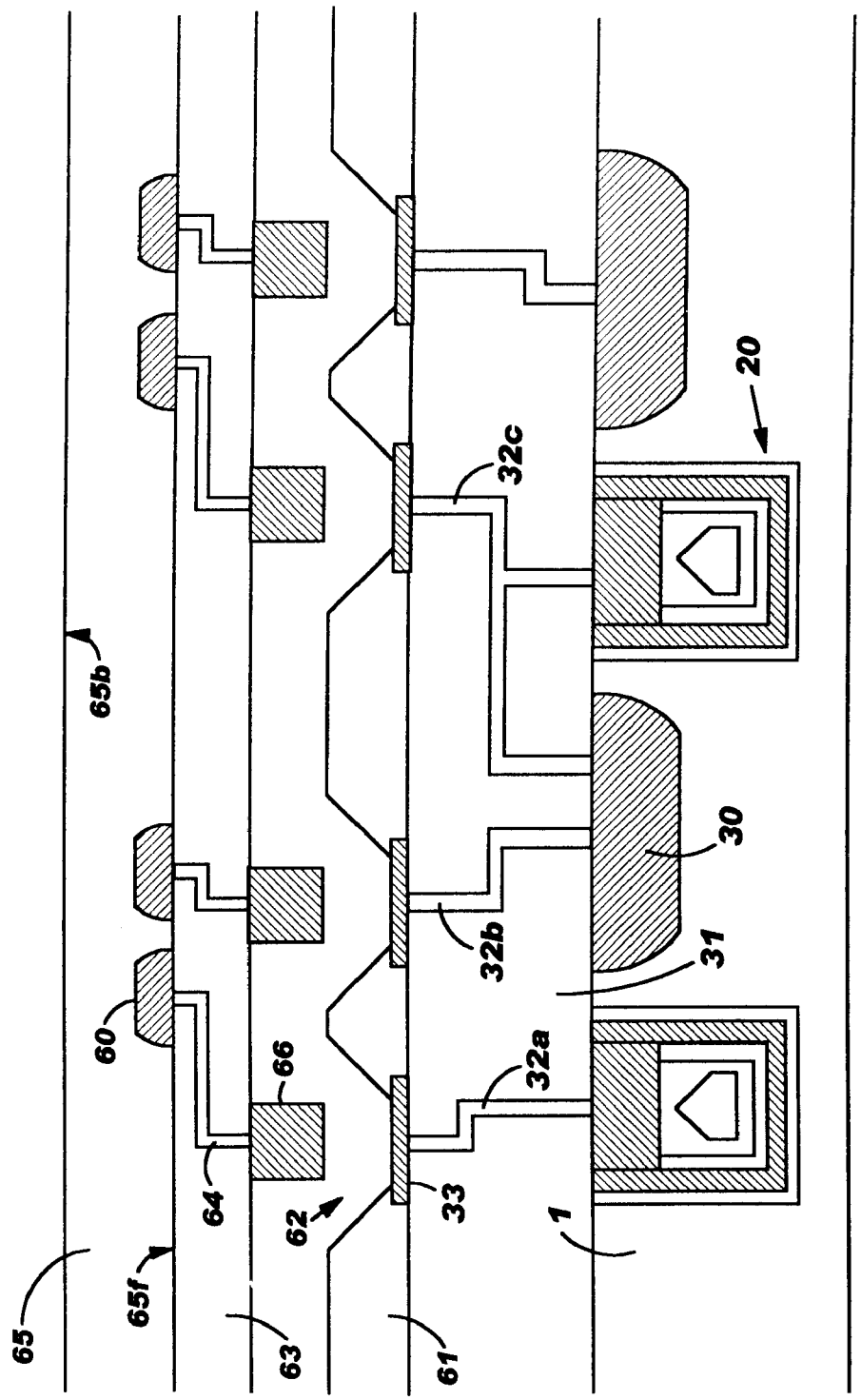
FIGS. 4A–4E illustrate steps in a process for obtaining wafer-level integration of DRAM and PE wafers using vertical interconnections, in accordance with another embodiment of the invention.

In FIG. 4A, wafer 1 has metallized trench structures 20 and devices 30 (e.g. DRAM devices) fabricated therein, with a dielectric layer 31 on top of the wafer containing electrical wiring and having pads 33 thereon (compare FIG. 3A). The trench structures are formed as described above with reference to FIGS. 2A–2F. The wafer has a dielectric layer 61, typically of polyimide, overlying layer 31. Layer 61 has via openings 62 formed therein, to expose pads 33. Another wafer 65, having devices 60 (e.g. PE devices) near front surface 65f, has a dielectric layer 63 formed thereon, with high-density wiring 64 for electrical connection to studs 66. As shown in FIG. 4A, devices 60 are connected to studs 66, and the studs correspond with the vias 62.

Figure 1A:
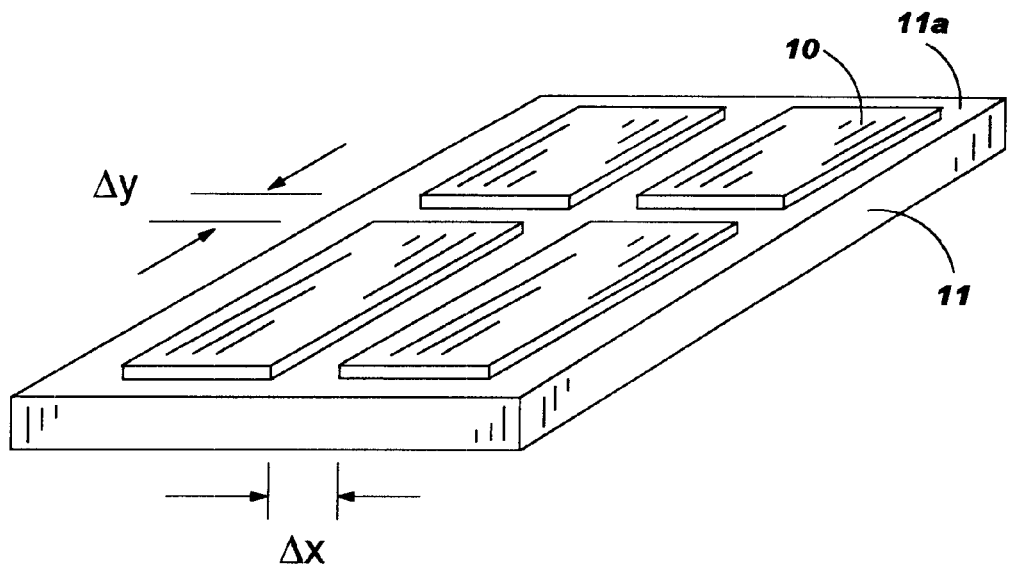
FIG. 1A is a schematic illustration of system on a chip in which smaller chips are arranged on a larger chip and are intergrated and connected in close proximity.
Figure 1B:
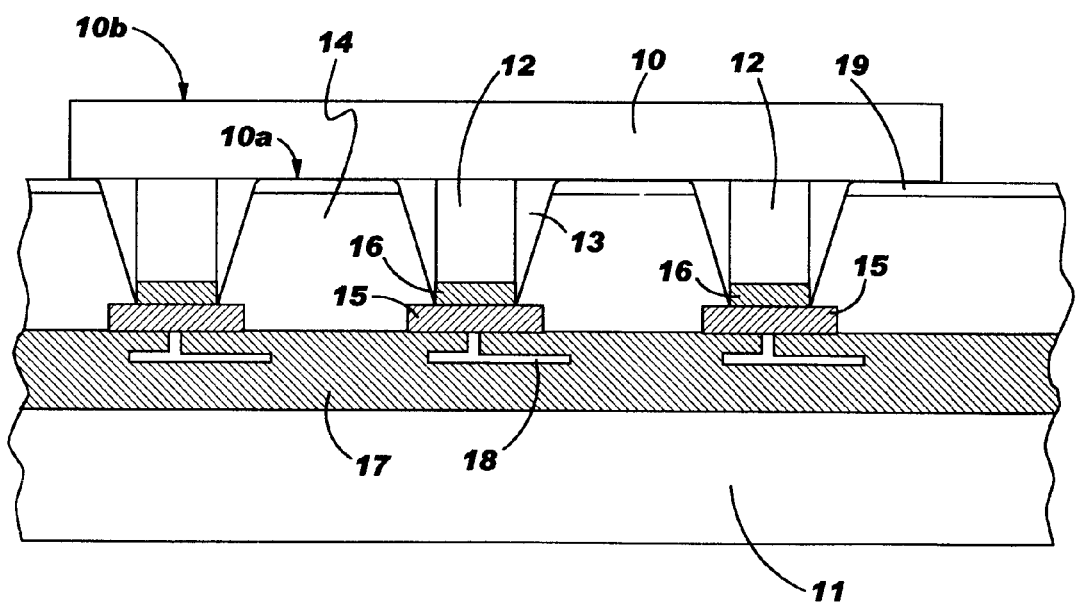
FIG. 1B illustrates a high accuracy, self-aligning stud/via interconnection scheme for the chips of FIG. 1A.
Figure 4B:
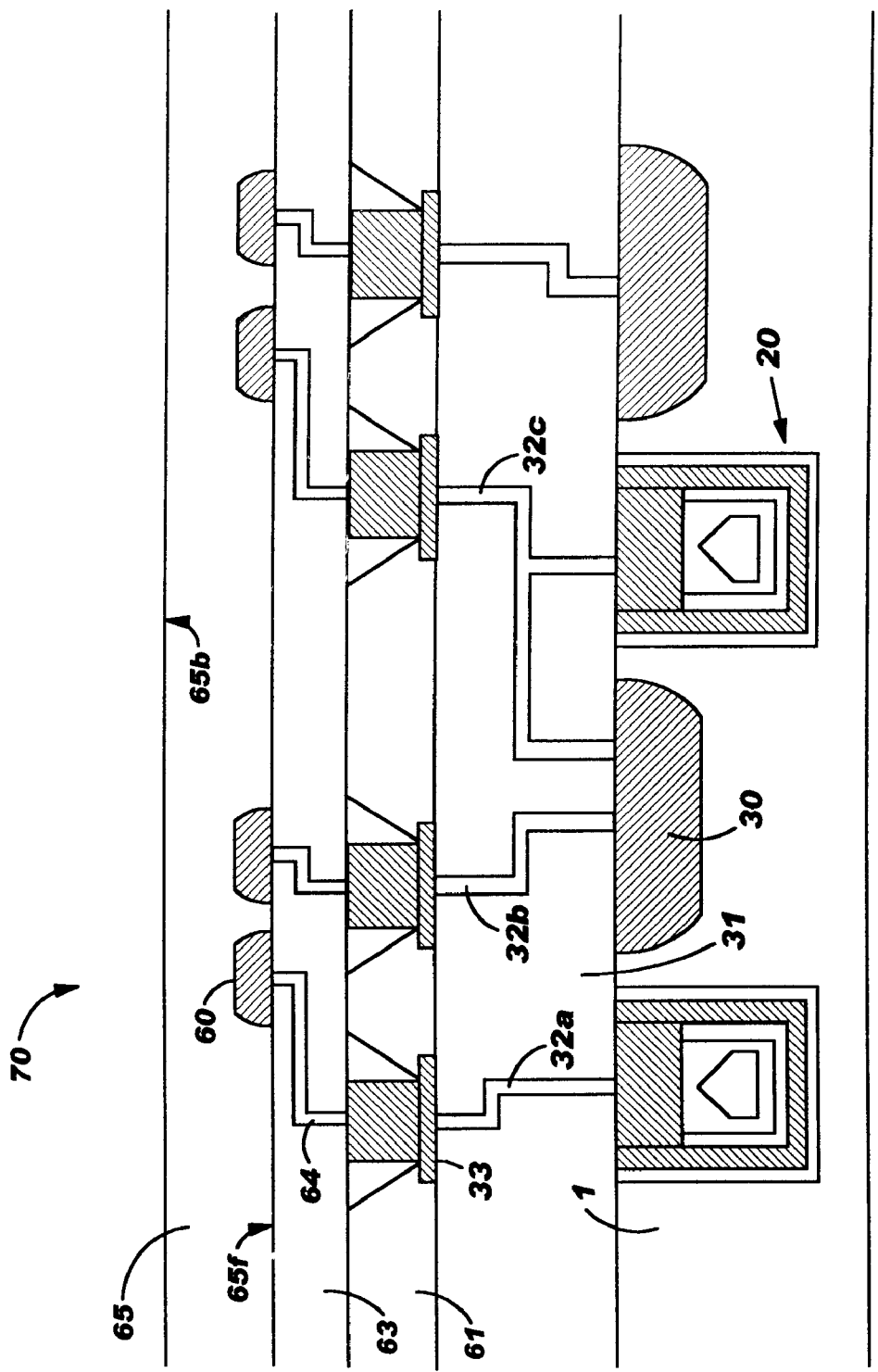

Wafer 1 and wafer 65 are then bonded together with studs 66 making electrical connection to pads 33, as shown in FIG. 4B. (The bonding may be facilitated by using a solder layer on the studs and/or an adhesive on the polyimide layer, as discussed above with reference to FIG. 1B.) The resulting wafer structure 70 thus contains interconnected devices; it should be noted that wafers 1 and 65 may have different device types (such as DRAM and PE devices) and/or be of different materials (Si, SiGe, GaAs, etc.).

Figure 4C:
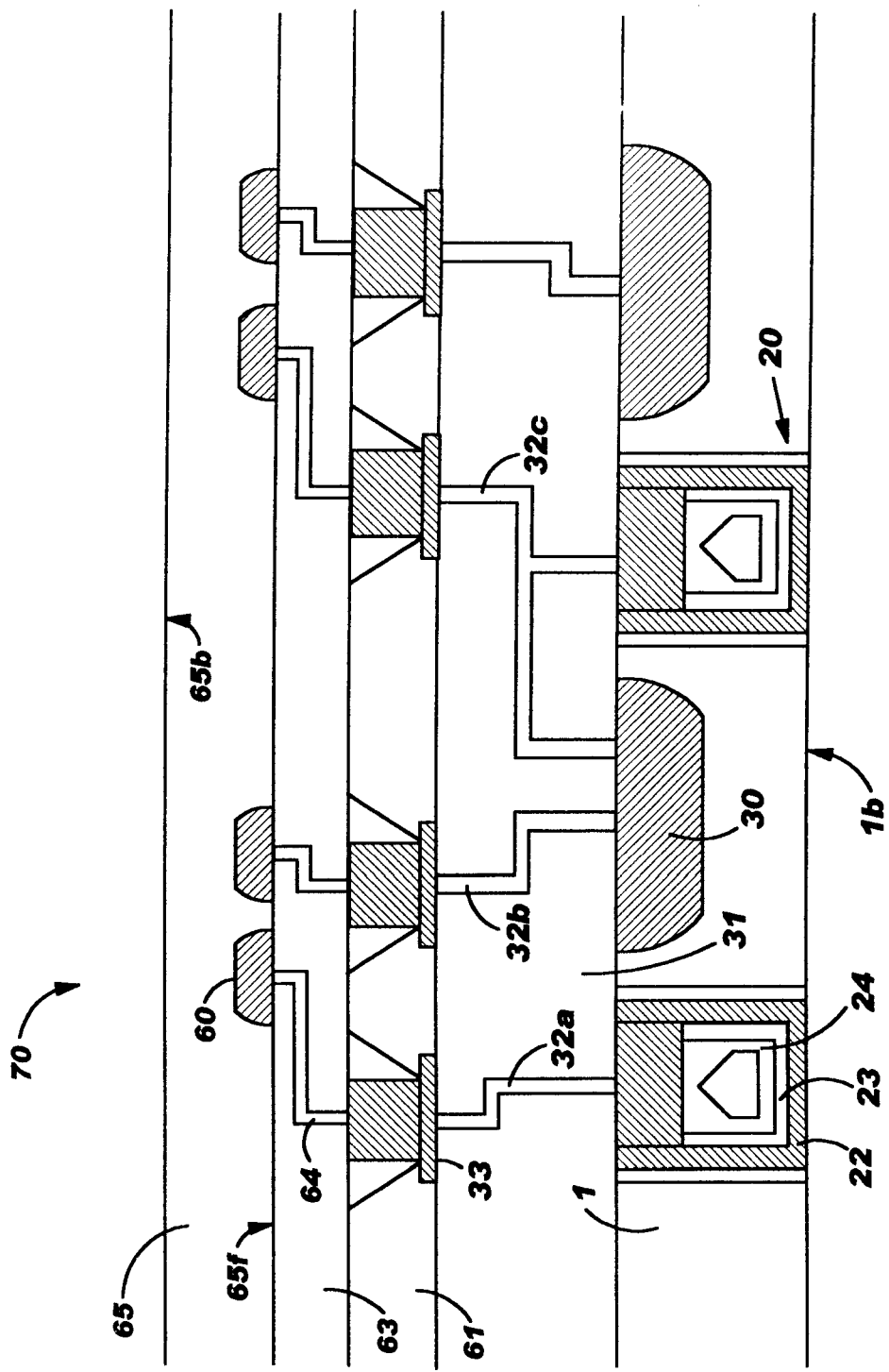

Wafer 1 is then thinned so that the trench structure 20 becomes a through-via, as in the previous embodiment (FIG. 4C; compare FIG. 3B). It should be noted that wafer 65 can function as a handling wafer while wafer 1 is thinned. Alternatively, wafer 65 may also be processed to have through-vias extending to back surface 65b; in this case wafer 65 may require bonding to a temporary handling plate (not shown) which is subsequently removed, prior to bonding of wafer 65 to wafer 1.

Figure 4D:
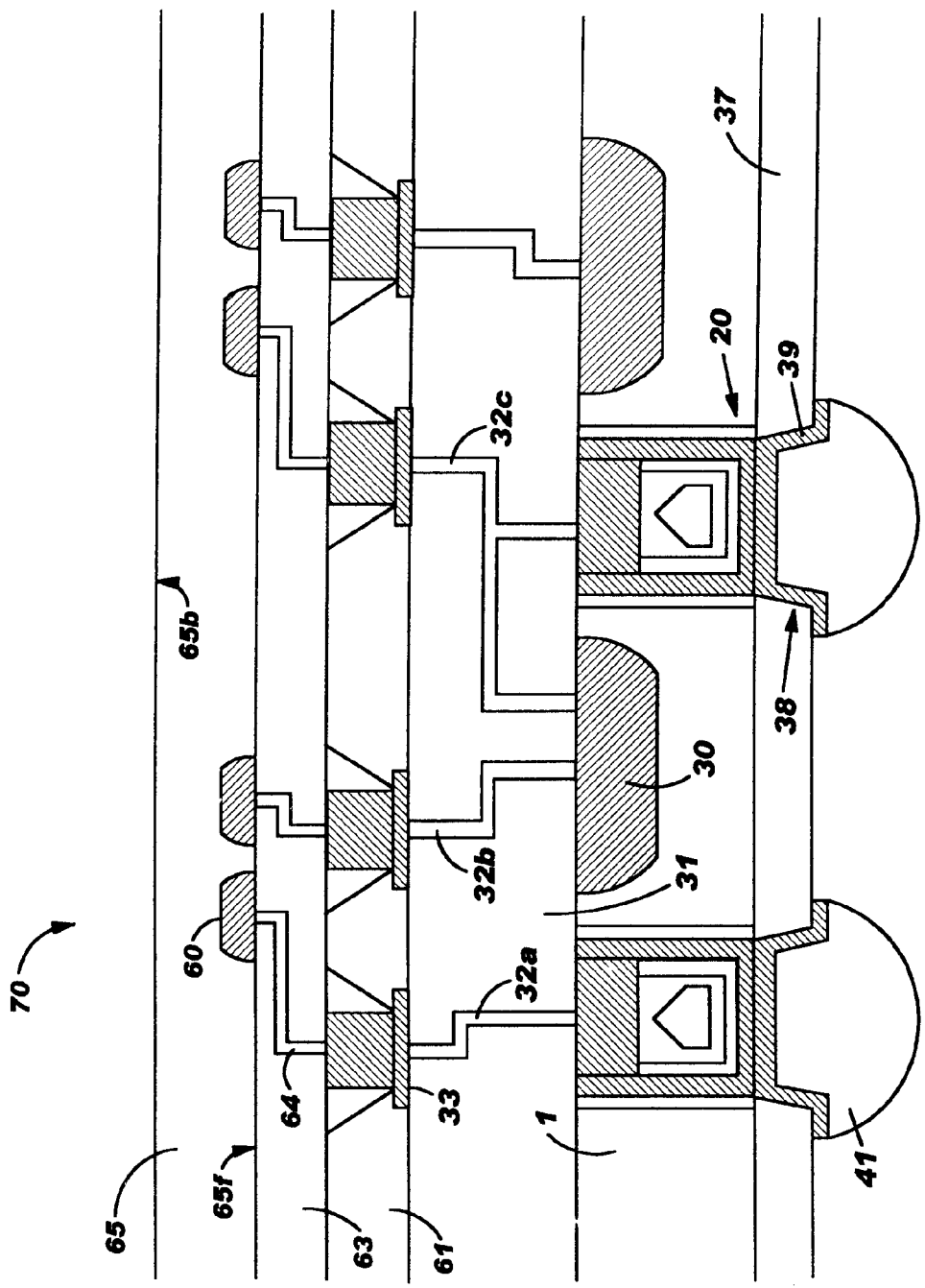

An insulating layer 37 (e.g. polyimide) is deposited on surface 1b, and openings 38 are formed therein, as in the previous embodiment. Pads 39 are then formed to make connections to the through-vias, and solder bumps 41 are attached to the pads (FIG. 4D).

Figure 4E:
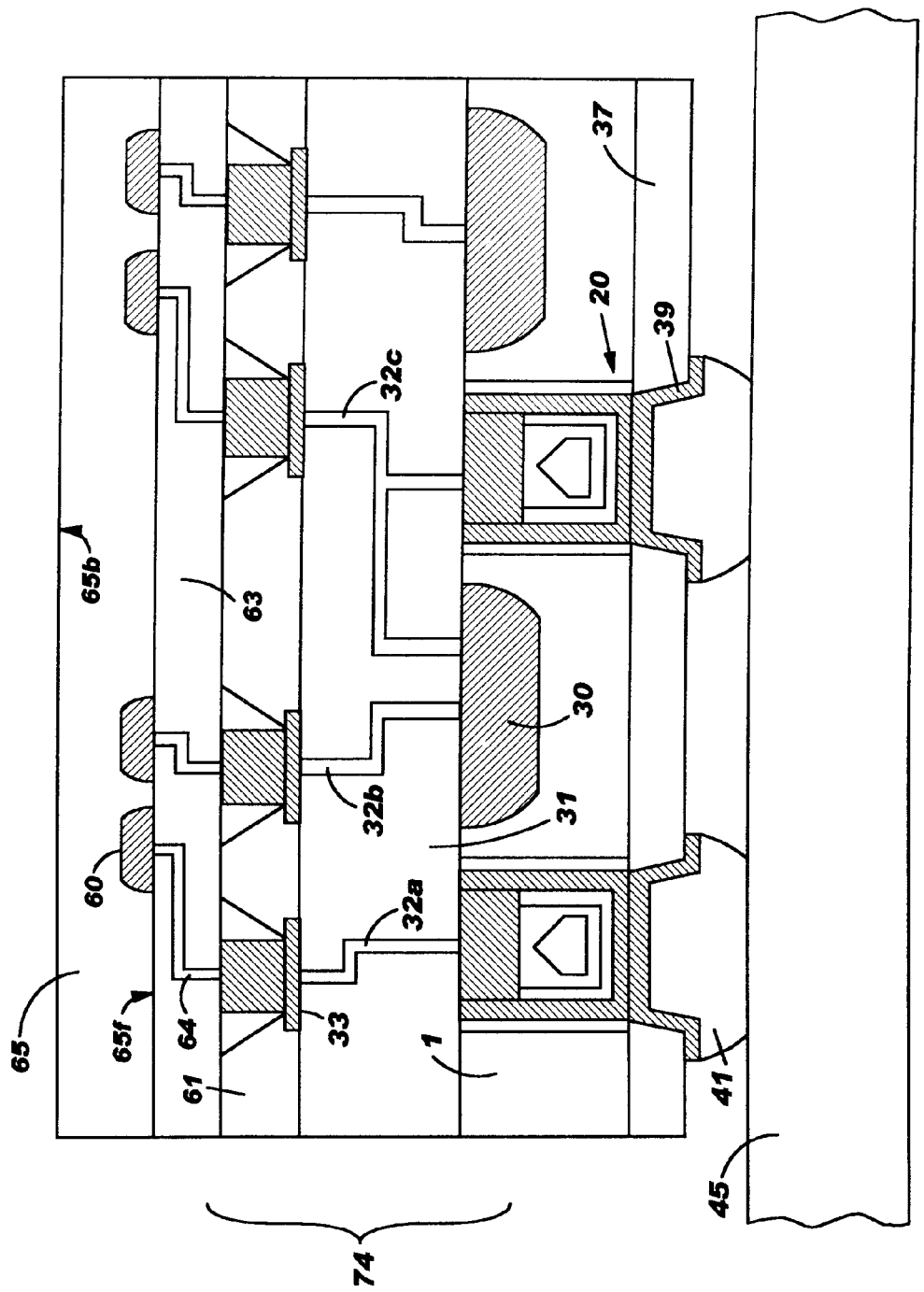

The wafer structure 70 is then diced to produced combined chips 74 (e.g. combined DRAM/PE chips), which are then joined to carrier 45, as shown in FIG. 4E. Any temporary handling plate used for wafer 65 is removed at this point. It will be appreciated that if wafer 65 has through-vias to back surface 65b, electrical connections may be made to the top surface of chip 74. Accordingly, further vertical integration may be accomplished.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for fabricating a semiconductor structure including a substrate having a top surface and a bottom surface, the method comprising the steps of:

forming a feature in the top surface of the substrate;

depositing metal in the feature to make a conducting path therein;

forming a layer overlying the top surface of the substrate, the layer including an electrical conductor and a first conducting pad on a top surface of the layer, the first conducting pad being electrically connected to the feature;

attaching a plate to the layer;

thinning the substrate at the bottom surface thereof, thereby exposing the bottom of the feature; and forming a second conducting pad on the bottom surface of the substrate to make an electrical connection to the bottom of the feature, so that the first conducting pad and the second conducting pad are electrically connected through the feature.

2. A method according to claim 1, further comprising the step of fabricating a semiconductor device in a region of the substrate adjacent to the top surface of the substrate.

3. A method according to claim 1, wherein said depositing step further comprises depositing metal so as to form a void in the feature.

4. A method according to claim 2, wherein the semiconductor device is a DRAM device.

5. A method according to claim 2, wherein the semiconductor structure comprises a first chip having a vertical electrical connection therethrough which connects the first conducting pad and the second conducting pad, and further comprising the step of:

connecting a second chip to the first chip using said vertical electrical connection so that the second chip is disposed on top of the first chip, so that the first chip and the second chip are vertically integrated.

6. A method according to claim 5, wherein the first chip includes a DRAM device and the second chip includes a processor.

7. A method according to claim 6, wherein a plurality of processor chips are disposed on a DRAM chip.

8. A method according to claim 1, wherein said thinning step comprises reducing the thickness of the substrate to less than about 100 $\mu$m.

9. A method according to claim 1, wherein the plate is a temporary handling plate, and further comprising the step of detaching the plate.

10. A method according to claim 9, wherein the plate is transparent to ablating radiation, and said detaching step comprises ablating an interface between the layer and the plate using ablating radiation transmitted through the plate.

11. A method according to claim 5, wherein the second chip includes another vertical electrical connection and conducting pads on a top surface of said chip.

12. A method according to claim 1, wherein the plate is a semiconductor wafer, the layer overlying the top surface of the substrate is characterized as a first layer, and said step of attaching the plate comprises the steps of:

forming a second layer on the first layer;

forming a via in the second layer to expose the first conducting pad;

forming a stud on the semiconductor wafer;

aligning the stud to the via; and contacting the semiconductor wafer to the second layer so that the stud makes electrical connection with the first conducting pad.

13. A method according to claim 12, further comprising the steps of:

fabricating a first semiconductor device in a region of the substrate adjacent to the top surface of the substrate; and fabricating a second semiconductor device in the semiconductor wafer, prior to said attaching step.

14. A method according to claim 13, wherein the first semiconductor device is connected to the first conducting pad through the first layer, and the second semiconductor device is connected to the stud, so that a vertical electrical connection therebetween is provided.

15. A method according to claim 14, wherein a plurality of DRAM devices are fabricated in the substrate and a plurality of processors are fabricated in the semiconductor wafer.

16. A method according to claim 12, wherein the substrate and the semiconductor wafer comprise a wafer system, and the method further comprises the step of dicing the wafer system to form a plurality of chips.

* * * * *